United States Patent [19]

Bard et al.

[11] 4,032,755

[45] June 28, 1977

[54] PROCESS CONTROL APPARATUS

[75] Inventors: Nicholas John Bard, Birmingham; Malcolm Williams, Solihull, both of England

[73] Assignee: The Lucas Electrical Company Limited, England

[22] Filed: June 16, 1975

[21] Appl. No.: 586,968

[30] Foreign Application Priority Data

June 18, 1974 United Kingdom ............. 26870/74

[52] U.S. Cl. ...................... 235/92 CC; 235/92 TC; 235/92 R; 235/92 CT; 235/150.21

[51] Int. Cl.[2] ....................................... H03K 21/30

[58] Field of Search ..... 235/150.21, 92 CC, 92 TC, 235/92 PB, 92 T, 92 CT; 328/48

[56] References Cited

UNITED STATES PATENTS

| | | | |
|---|---|---|---|
| 3,835,819 | 9/1974 | Anderson | 235/150.21 |
| 3,838,397 | 9/1974 | Watson et al. | 235/150.21 |

*Primary Examiner*—Joseph M. Thesz
*Attorney, Agent, or Firm*—Kane, Dalsimer, Kane, Sullivan and Kurucz

[57] ABSTRACT

A process control apparatus, for example for internal combustion engine fuel injection control, includes a digital memory which produces an *n*-bit digital output in accordance with two independently variable input signals. The *m* most significant bits are transferred to a counter which is clocked to give a pulse length output. The *n-m* least significant bits control a logic circuit which is used to program another counter which is used to introduce an added delay to each output pulse. This arrangement enables higher resolution to be obtained using a limited size main counter.

4 Claims, 1 Drawing Figure

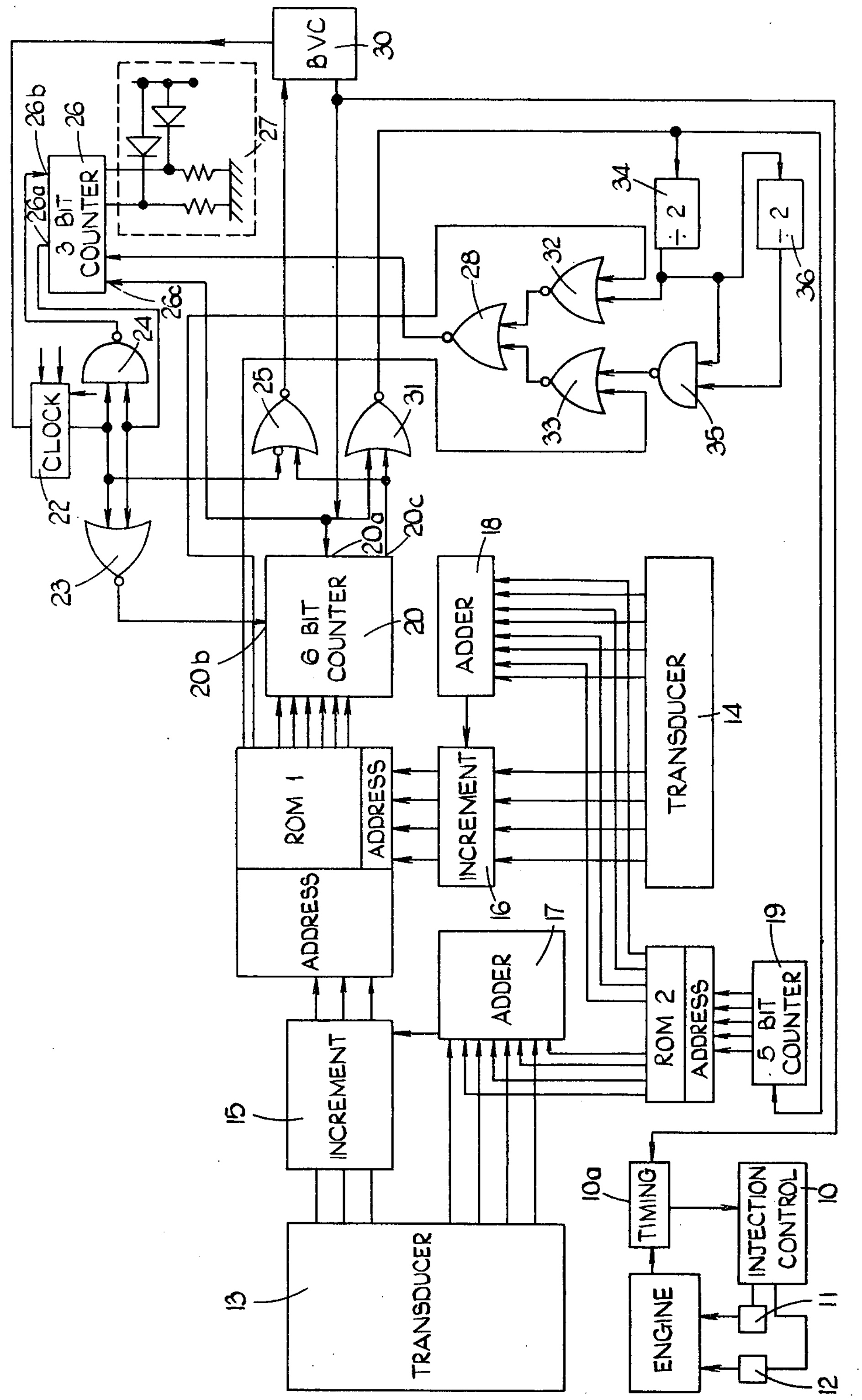
BVC
30
26b
26
26a
3 BIT COUNTER
27
26c
34
÷ 2
32
28
36
÷ 2
24
CLOCK
25
31
33
35
22
23
20a
20c
18
ADDER
6 BIT COUNTER
20
20b
TRANSDUCER
14
ROM 1
ADDRESS
INCREMENT
16
ADDRESS
17
ADDER
19
ROM 2
ADDRESS
5 BIT COUNTER
15
INCREMENT
10a
TIMING
INJECTION CONTROL
10
11
ENGINE
12
13
TRANSDUCER

PROCESS CONTROL APPARATUS

This invention relates to process control apparatus of the type which produces a pulse length modulated output, modulated in accordance with two different parameters.

Process control apparatus in accordance with the invention comprises a digital memory unit which produces an *n*-bit digital output signal dependent upon two independent digital input signals, an *m*-bit digital programme counter (where *m* is less than *n*)programmable by the *m* most significant bits of the digital output signal of the digital memory unit, a clock pulse source, a gate controlling admission of clock pulses to the counter, a delay circuit connected to control said gate and a sampling circuit connected to the $n - m$ least significant bit or bits of the memory unit to vary the delay introduced by said delay circuit in accordance with said least significant bit or bits during alternate cycles of the counter, the output pulse length being determined by the sum of said delay and the time taken to clock the counter from the count programmed by the *m* most significant bits to a predetermined count.

An example of the invention is illustrated diagrammatically in the accompanying drawing.

The process control apparatus shown is intended primarily for use in an internal combustion engine fuel injection system wherein there is an injection control circuit 10 which is triggered into operation periodically in synchronism with the engine by a timing device **10*a* including for example a contact breaker driven by the engine shaft. The injection control circuit 10 is arranged to drive one of a pair of injectors 11, 12 into an open condition so that fuel is injected. The injectors 11, 12** are opened alternatively.

The length of time for which each injector remains open on each triggering is controlled by the process control apparatus of the prsent invention in accordance with two main engine operating parameters such as throttle angle and engine speed.

The process control apparatus includes a diode matrix type read-only memory unit ROM 1 such as is described in our prior U.K. patent application Nos. 59506/71 and 33235/72. This memory unit ROM 1 receives a three bit digital input and a four bit digital input and produces an eight bit digital output which is variable independently with the two inputs in the known manner. The two input signals are derived from digital transducers 13, 14 respectively. The transducer 13 is the throttle angle transducer and my consist either of a digital encoder on the throttle shaft or the combination of an analogue shaft angle transducer coupled to an analogue to digital converter. In any event the transducer 13 produces a seven bit digital output but only the three most significant bits are fed to the memory unit ROM 1 via an incrementor circuit 15. Similarly the transducer 14 produces an eight bit digital output which is dependent on the engine speed, but only the four most significant bits of this output are fed to the memory unit ROM 1 via a further incrementor circuit 16.

The four least significant bits of the outputs of the transducers 13, 14 are fed to two digital adder circuits 17, 18 which also receive inputs from a second read-only memory unit ROM 2 which is addressed by a five bit counter 19. The carry-out terminal of each adder 17, 18 is connected to an input terminal of the associated incrementor circuit 15 or 16 so that the output thereof is increased by one in its least significant bit whenever a pulse appears at the carry-out terminal of the adder 17 or 18. The memory unit ROM 2 is programmed to produce a cyclically varying output to the two adders 17 and 18 so that, in effect, and as described in our Application No. 59506/71, account is taken in the addressing of the memory unit ROM 1 of the least significant bits of the signals produced by the transducers 13, 14, thereby giving an effect of interpolation between the discrete values of the parameters measured by the transducers.

The eight bit output of the memory unit ROM 1 is split into two parts, the six most significant bits being fed to a six bit binary counter 20. The counter 20 is set by a pulse received at a 'set' terminal **20*a* and has a clock input terminal 20*b* at which pulses are received to clock the counter upwardly. The counter 20 has a "carry-out" output terminal 20*c* from which a logical 0 pulse issues when all the stages of the counter 20** are in their 1 states.

The apparatus includes a clock pulse generator 22 the frequency of which may, if required, be variable in accordance with one or more further engine parameters such as air temperature or coolant temperature. The output of the generator 22 is applied to one terminal of a NOR gate 23 the output terminal of which is connected to the clock terminal **20*b* of the counter 20. The output of generator 22 is also connected to one terminal of a NAND gate 24 and to an inverting input terminal of a NOR gate 25 which has a further input from the terminal 20*c*. The gates 23 and 24 both have input terminals connected to the carry-out terminal 26*a* of a three bit binary counter 26, the clock terminal of which is connected to the output terminal of the gate 24. The two most significant bit stages of the counter 26 are connected to a biasing circuit 27 so that whenever the counter 26 is set by a pulse at its 'set' terminal 26*c* these two stages are both set to the 0 state. The remaining stage is programmable via a NOR gate 28** as will be hereinafter explained.

The effect of the circuit described will be for there to be a delay of either six or seven pulses between the setting of the counters 20, 26 and the clocking of the counter 20. Thus, initially, there will be a logical 1 output from the terminal **26*a* to both gates 23 and 24 so that gate 23 will not pass pulses from the clock 22, but gate 24 will. The pulses clock the counter 26 the initial state of which will have been set to either 000 or 001 depending on whether there is an output from the gate 28. In the first case there will be a delay of seven pulses before the output disappears from the terminal 26*a* and in the second case a delay of only six pulses. Disappearance of this output allows the gate 23 to pass pulses to the counter 20 but blocks the gate 24. Clocking of the counter 20** thus commences.

The clock pulse following that which sets the counter 20 to its maximum count causes a pulse to be delivered by the gate 25 to a battery voltage compensation circuit 30 which produces a delay dependent to the vehicle battery voltage. If the battery voltage is low the delay is increased and this compensates for the increased time taken for the injectors to open in these circumstances. The battery voltage compensation circuit 30 produces an output pulse to the 'set' terminals **20*c* and 26*c* of the counters 20, 26**.

The five bit binary counter 19 is clocked cyclically by pulses from a NOR gate 31 which has inputs from terminal 20c of the counter 20 and from the compensation circuit 30. Thus the following cycle will be repeated:

a. the clock pulse generator 22 will trigger the battery voltage compensation circuit 30, b. during a delay dependent on the battery voltage the counters 20, 26 will be set to the initial values determined by the memory unit ROM 1 and the gate 28 respectively, c. the counter 26 will be clocked to maximum and d. the counter 20 will be clocked to maximum.

The total length of this sequence is the sum of the delay (b), the count time (c) and the count time (d). At the end of this cycle a pulse is produced by the NOR gate 31 to clock the counter 19 which changes the ROM 2 output code and incrementor inputs. A pulse from gate 25 triggers the BVC to stop the clock and re-set the counter 20 to the ROM 1 output.

The gate 28 has two inputs from a pair of NOR gates 32, 33 respectively. The NOR gate 33 has one input from the least significant bit terminal of the unit ROM 1 and the gate 32 has an imput from the second least significant bit terminal of the unit ROM 1. The gate 32 also has an input from a flip-flop circuit 34 driven by the output of the gate 31 so that the second least significant bit terminal of the unit ROM 1 is interrogated on alternate cycles. The gate 33 has an input from a NAND gate 35 which has one input from the flip-flop 34 and another input from a further flip-flop circuit 36 driven by the first mentioned output of the flip-flop 34. This arrangement has the effect of causing the least significant bit terminal of the unit ROM 1 to be interrogated on the third cycle of each successive group of four cycles. The net effect of this arrangement is illustrated in the table below:

| | | Count in 26 | | | |
|---|---|---|---|---|---|
| LSB | 2nd LSB | 1st | 2nd | 3rd | 4th |
| 0 | 0 | 6 | 7 | 7 | 7 |
| 1 | 0 | 6 | 7 | 6 | 7 |
| 0 | 1 | 6 | 6 | 7 | 6 |
| 1 | 1 | 6 | 6 | 6 | 6 |

The resolution of the control is thus improved by a factor of four without increasing the clock frequency of clock 22. Resolution could be improved by increasing the clock frequency but a factor of four increase would make the frequency too high for reliable operation of the logic circuits, counters etc. The delay introduced by the counter 26 is, in any event, desirable since it can be used to provide a minimum output length pulse, thereby permitting better utilisation of the unit ROM 1.

The injection control circuit 10 opens the injector on the first BVC pulse after having been triggered by a crank shaft timing pulse and closes the injector on the 33rd pulse; thus the injector has been open throughout a complete 32 step cycle of ROM 2.

We claim:

1. Process control apparatus for producing a pulse length modulated output, modulated in accordance with two different input parammeters, and comprising a digital memory unit which produces an *n*-bit digital output signal dependent upon two independent digital input signals, an *m*-bit digital programme counter (where *m* is less than *n*) that is clocked cyclically and programmable by the *m* most significant bits of the digital output signal of the digital memory unit, a clock pulse source, a gate controlling admission of clock pulses cyclically to the counter, a delay circuit connected to control said gate and a sampling circuit connected to the $n - m$ least significant bit or bits of the memory unit to vary the delay introduced by said delay circuit in accordance with said least significant bit or bits during alternate cycles of the counter, the output pulse length being determined by the sum of said delay and the time taken to clock the counter from the count programmed by the *m* most significant bits to a predetermined count.

2. Apparatus as claimed in claim 1 in which said delay circuit includes a further counter the most significant bits of which are set in each cycle to constant values and the least significant bit of which is set in accordance with the $n - m$ least significant bits of the programme counter and a control circuit directing clock pulses to the further counter instead of the programme counter for a period during each cycle to delay the commencement of clocking of the programme counter for a period determined by the count set in the further counter.

3. Apparatus as claimed in claim 2 in which the setting of the least significant bit of said further counter is controlled by a logic circuit having inputs connected to the $n - m$ least significant bit outputs of the memory unit and to "carry-out" output terminal of the programme counter.

4. An internal combustion engine fuel injection system comprising a plurality of fuel injectors which are electrically operable and a process control apparatus as claimed in claim 1 controlling the length of time of opening said injectors, the memory unit being addressed by signals derived from two transducers sensitive to independently variable engine parameters.

* * * * *